United States Patent
Senda et al.

(10) Patent No.: US 6,925,100 B2
(45) Date of Patent: Aug. 2, 2005

(54) COMMUNICATION DEVICE

(75) Inventors: Masanobu Senda, Aichi (JP); Naoki Shibata, Aichi (JP)

(73) Assignee: Toyoda Gosei Co., Ltd., Nishikasugai-gun (JP)

(*) Notice: Subject to any disclaimer, the term of this patent is extended or adjusted under 35 U.S.C. 154(b) by 207 days.

(21) Appl. No.: 10/620,572

(22) Filed: Jul. 17, 2003

(65) Prior Publication Data
US 2004/0028096 A1 Feb. 12, 2004

(30) Foreign Application Priority Data

Jul. 19, 2002  (JP) ........................................ 2002-211766

(51) Int. Cl.⁷ ................................................. H01S 5/00
(52) U.S. Cl. ......................................... 372/36; 372/46
(58) Field of Search ............................. 372/36, 38.07, 372/43–50, 75; 257/734, 737, 99; 438/613, 792

(56) References Cited

U.S. PATENT DOCUMENTS

| | | | | | |
|---|---|---|---|---|---|
| 5,798,536 | A | * | 8/1998 | Tsutsui | 257/99 |
| 6,023,076 | A | * | 2/2000 | Shibata | 257/94 |
| 6,404,792 | B1 | * | 6/2002 | Yamamoto et al. | 372/46 |
| 6,680,490 | B2 | * | 1/2004 | Yasukawa et al. | 257/98 |
| 6,761,303 | B2 | * | 7/2004 | Ozawa | 228/123.1 |

FOREIGN PATENT DOCUMENTS

| | | |
|---|---|---|
| JP | 4-242985 | 8/1992 |
| JP | 11-177175 | 7/1999 |

* cited by examiner

Primary Examiner—Minsun Oh Harvey
Assistant Examiner—Tuan N. Nguyen
(74) Attorney, Agent, or Firm—McGinn & Gibb, PLLC

(57) ABSTRACT

In an LED, the area of contact between an ohmic electrode formed on a contact layer and the contact layer serves as an effective light-emitting area of a light-emitting layer. Therefore, while the area of contact between the ohmic electrode and the contact layer is kept small, a seat electrode is interposed so that the seat electrode is connected to a circuit wiring on a wiring board by a ball electrode being contact with the seat electrode at an area larger than the area. As a result, the size necessary for forming the ball electrode can be secured easily and the light-emitting area of the light-emitting layer in the LED can be reduced sufficiently. Accordingly, a capacitance component formed by clamping the light-emitting portion of the light-emitting layer can be reduced, so that a time constant at a leading edge of luminance and a time constant at a trailing edge of luminance can be reduced sufficiently to obtain a high speed.

5 Claims, 1 Drawing Sheet

COMMUNICATION DEVICE

Figure 1:
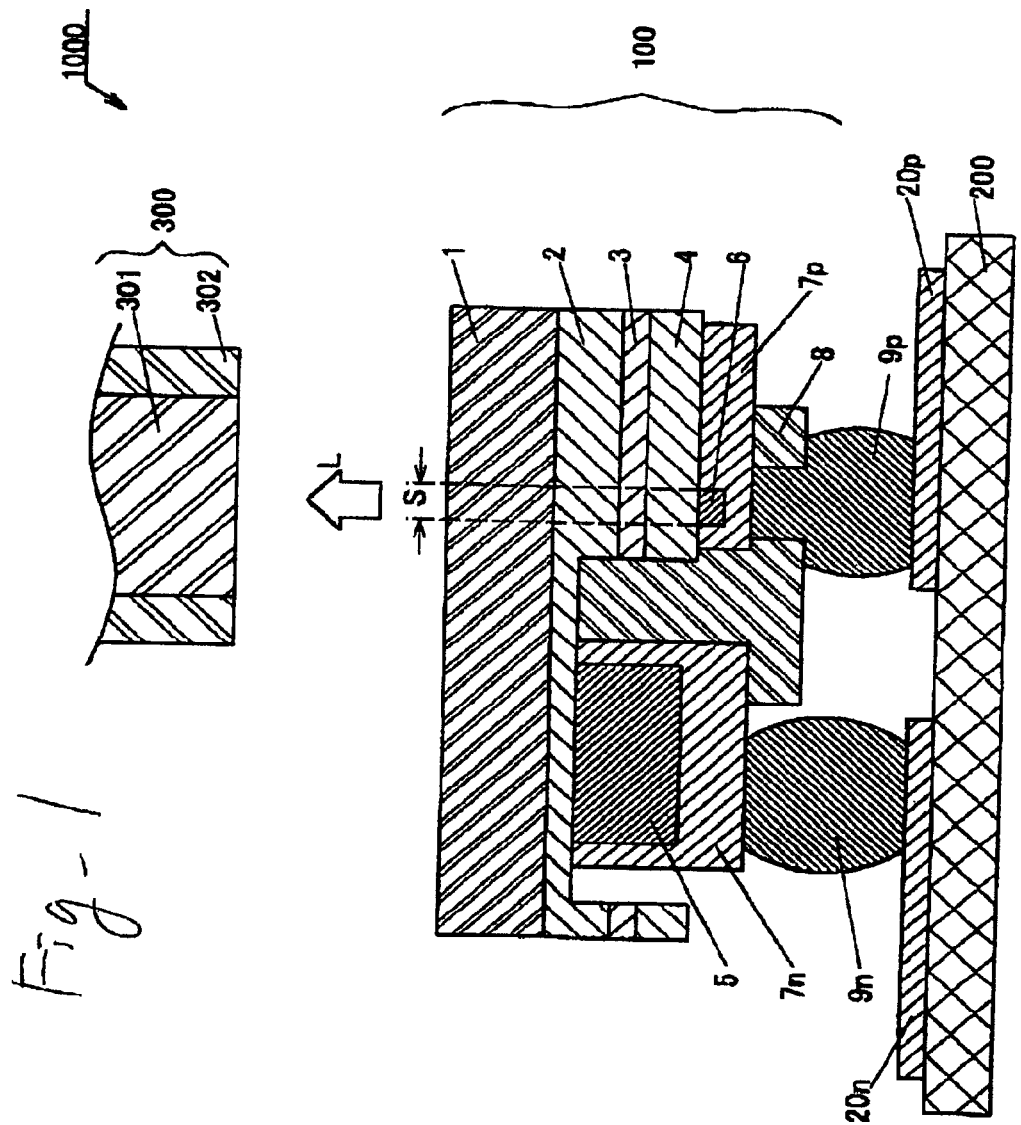

The present application is based on Japanese Patent Application No. 2002-211766, which is incorporated herein by reference.

BACKGROUND OF THE INVENTION

1. Field of the Invention

The present invention relates to a light-emitting element using Group III nitride compound semiconductors for optical communication. For example, the intention can be applied to an optical transmitter of a communication system using a plastic optical fiber (POF).

2. Description of the Related Art

A system using a light-emitting diode (hereinafter simply referred to as "LED") as a light source for a short-distance LAN using a plastic optical fiber (POF) has been known recently. In the system, a red LED using a GaAs compound semiconductor is used as a light-emitting element for optical communication. Short-distance communication using an LED has been examined and developed eagerly. The high cutoff frequency of the red LED is 30 MHz.

The transmission loss of the POF is low in a short wavelength range, for example, in an emission wavelength range of from 450 nm to 550 nm. Accordingly, for optical communication using the POF, use of a light-emitting element such as an LED emitting light in an emission wavelength range of from 450 nm to 550 nm is preferred to use of the red LED. It is therefore conceived that a light-emitting element using a Group III nitride compound semiconductor is used as a light source for optical communication.

When an existing Group III nitride compound semiconductor light-emitting element is used, there is however a problem that the response rate is low. Firstly, there is a problem that light-emitting characteristic deteriorates as current density increases, that is, luminance is saturated relative to current. Further, for example, a p-layer or a p-electrode on the p-type layer needs to be small-sized in order to reduce a capacitance component formed by a light-emitting layer to improve the response rate. It is however difficult to perform bonding if the size of the p-layer or p-electrode is too small.

SUMMARY OF THE INVENTION

The invention is accomplished to solve the problem and an object of the invention is to reduce the capacitance component formed by the light-emitting layer to thereby improve the response rate of luminance relative to current.

To solve the problem, the invention provides a Group III nitride compound semiconductor light-emitting element adapted to be mounted on a wiring board in the form of a flip chip, the Group III nitride compound semiconductor light-emitting element comprising: a light-emitting layer; a contact layer made of a Group III nitride compound semiconductor and formed above the light-emitting layer; an ohmic electrode formed on the contact layer; a seat electrode formed on the contact layer so that the ohmic electrode is covered with the seat electrode; and a ball electrode for electrically connecting the seat electrode and a circuit wiring of the wiring board to each other; wherein an area of contact between the seat electrode and the ball electrode is larger than an area of contact between the contact layer and the ohmic electrode.

In addition, a communication device can be formed by a combination of an optical fiber, a wiring board, and the above Group III nitride compound semiconductor light-emitting element mounted on the wiring board in the form of a flip chip and coupled to the optical fiber.

Preferably, the wavelength of light emitted from the Group III nitride compound semiconductor light-emitting element is in a range of from 450 nm to 550 nm. Preferably; the area of contact between the contact layer and the ohmic electrode is not larger than 0.025 $mm^2$. Preferably, the optical fiber is a plastic optical fiber.

In a Group III nitride compound semiconductor light-emitting element, the area of contact between an ohmic electrode formed on a contact layer and the contact layer serves as an effective light-emitting area of a light-emitting layer. Therefore, while the area of contact between the ohmic electrode and the contact layer is kept small, a seat electrode is interposed so that the seat electrode is connected to a circuit wiring on a wiring board by a ball electrode. As a result, the size of the ball electrode need not be so small. The size necessary for forming the ball electrode can be secured easily and the light-emitting area of the light-emitting layer in the Group III nitride compound semiconductor light-emitting element can be reduced sufficiently. Accordingly, a capacitance component formed by clamping the light-emitting portion of the light-emitting layer can be reduced, so that a time constant at a leading edge of luminance and a time constant at a trailing edge of luminance can be reduced sufficiently to obtain a high speed. Furthermore, variation in elements at the time of production can be suppressed. In addition, because the ball electrode has a heat-radiating effect, the ball electrode can be large-sized from the point of view of heat radiation.

When the light-emitting element is combined with a POF, it can be used for a long-distance purpose. It is therefore preferable that the light-emitting element emits light in an emission wavelength range of from 450 nm to 550 nm. In addition, because the light-emitting element is mounted on a wiring board in the form of a flip chip, that is, because the contact layer above the light-emitting layer is provided as the ground side, better heat radiation can be obtained.

DETAILED DESCRIPTION OF THE PREFERRED EMBODIMENTS

FIG. 1 is a sectional view showing important part of a communication device 1000 according to a specific embodiment of the invention. The invention can be applied to a light-emitting element having any electrode arrangement as shown in FIG. 1 and as described as follows. Incidentally, the invention is not limited to FIG. 1 and the following embodiment.

In FIG. 1, the communication device 1000 is formed as follows. A Group III nitride compound semiconductor LED (hereinafter simply referred to as "GaN LED") 100 is mounted on a wiring board 200 through ball electrodes 9n and 9p and aligned to a POF 300. In FIG. 1, the POF 300 includes a core portion 301, and a clad portion 302. In FIG. 1, circuit wirings 20n and 20p electrically connected to the ball electrodes 9n and 9p of the GaN LED 100 respectively are formed on the wiring board 200.

In the GaN LED 100, an n-type GaN layer 2, a light-emitting layer 3 having a multiple quantum well structure made of InGaN/GaN and a p-type GaN layer (contact layer) 4 are formed on a sapphire substrate 1. An n-electrode 5 having an ohmic contact is provided on an exposed portion of the n-type GaN layer 2. A p-electrode (ohmic electrode) 6 having an ohmic contact is provided on the p-type GaN layer (contact layer) 4. On this occasion, the area of a contact portion S between the p-electrode (ohmic electrode) 6 and the p-type GaN layer 5 (contact layer) 4 is selected to be not larger than 0.025 mm$^2$. Although a buffer layer is omitted in the GaN LED 100 shown in FIG. 1, a buffer layer may be provided between the sapphire substrate 1 and the n-type GaN layer 2. Although the n-type GaN layer 2, the light-emitting layer 3 having a multiple quantum well structure made of InGaN/GaN and the p-type GaN layer (contact layer) 4 are provided as a three-layer structure, one layer or a plurality of layers may be provided between the sapphire substrate 1 and the n-type GaN layer 2 on which the n-electrode 5 is provided, between the n-type GaN layer 2 on which the n-electrode 5 is provided and the light-emitting layer 3 having a multiple quantum well structure made of InGaN/GaN or between the light-emitting layer 3 having a multiple quantum well structure made of InGaN/GaN and the p-type GaN layer (contact layer) 4 on which the p-electrode (ohmic electrode) 6 is provided, as occasion demands.

Then, an n-side seat electrode 7n is formed so that the n-electrode 5 is covered with the n-side seat electrode 7n. A p-side seat electrode 7p is formed on the p-type GaN layer (contact layer) 4 so that the p-electrode (ohmic electrode) 6 is covered with the p-side seat electrode 7p. The p-side seat electrode 7p is formed So that ohmic characteristic is not generated between the p-side seat electrode 7p and the p-type GaN layer (contact layer) 4. For example, this can be achieved when the p-electrode (ohmic electrode) 6 and the p-side seat electrode 7p are made of different metals respectively. Then, a protective film 8 is formed so that the ball electrodes do not come into contact with each other when the LED 100 is mounted on the wiring board 200. The protective film 8 is provided so that a space between the n-side seat electrode 7n and a side surface of the light-emitting layer 3 and the p-type GaN layer (contact layer) 4 facing the n-side seat electrode 7n is covered with the protective film 8 while the n-side seat electrode 7n and the p-side seat electrode 7p are partially covered with the protective film 8 beyond the facing portion. On this occasion, an exposed portion of the p-side seat electrode 7p is formed above the p-electrode (ohmic electrode) 6 so that the area of the exposed portion is larger than the area S of contact between the p-electrode (ohmic electrode) 6 and the p-type GaN layer (contact layer) 4. Because contact is prevented by the protective film 8 in this manner, the ball electrodes 9n and 9p are provided on the exposed portions of the n-side seat electrode 7n and the p-side seat electrode 7p respectively. Gold or solder having fluidity at the time of mounting can be used as the material of the ball electrodes 9n and 9p. When the ball electrodes 9n and 9p are connected to the circuit wirings 20n and 20p respectively, mounting of the GaN LED 100 is completed.

In this manner, the contact portion S between the p-electrode (ohmic electrode) 6 and the p-type GaN layer (contact layer) 4 is provided so as to be contained in the contact portion between the ball electrode 9p and the p-side seat electrode 7p when viewed from the light-radiating direction L. Accordingly, the light-emitting area (substantially equal to the area of the contact portion S) can be made smaller than the area of contact between the ball electrode 9p and the p-side seat electrode 7p. Accordingly, when, for example, a current of 10 mA is supplied to the area of the contact portion S of not larger than 0.025 mm$^2$, current density of not lower than, 400 mA/mm$^2$ can be obtained. When the circuit wiring 20p being in contact with the ball electrode 9p is provided as the ground side, that is, when the LED 100 is mounted on the wiring board 200 in the form of a flip chip, a better heat-radiating effect can be provided.

Incidentally, the semiconductor material of the semiconductor light-emitting element is not limited to the embodiment. When the semiconductor light-emitting element is made of Group III nitride semiconductors, respectively formed semiconductor layers can be made of Group III nitride compound semiconductors, etc., including binary, ternary or quaternary semiconductors at least represented by the general formula $Al_xGa_yIn_{1-x-y}N$ ($0 \leq x \leq 1$, $0 \leq y \leq 1$, $0 \leq x+y \leq 1$). The Group III elements may be partially replaced by boron (B) and thallium (Tl). The nitrogen (N) may be partially replaced by phosphorus (P), arsenic (As), antimony (Sb), and bismuth (Bi).

When these semiconductors are used for forming n-type Group III nitride compound semiconductor layers, Si, Ge, Se, Te, C, etc. may be added as n-type impurities When these semiconductors are used for forming p-type Group III nitride compound semiconductor layers, Zn, Mg, Be, Ca, Sr, Ba, etc. may be added as p-type impurities.

Examples of the material of the substrate for growing these semiconductor layers as crystals include sapphire, spinel, Si, SiC, ZnO, MgO, and Group III nitride compound single crystal.

As methods for growing these semiconductor layers as crystals, there are effective a molecular beam epitaxy method (MBE), a metal organic chemical vapor deposition method. (MOCVD), a halide vapor phase epitaxy method (HVPE), a liquid phase epitaxy method, etc.

This invention is not at all limited to the description of the mode for carrying out the invention. This invention includes various modifications that can be conceived easily by those skilled in the art, without departing from the scope of claim.

What is claimed is:

1. A Group III nitride compound semiconductor light-emitting element adapted to be mounted on a wiring board in the form of a flip chip, said Group III nitride compound semiconductor light-emitting element comprising:

a light-emitting layer;

a contact layer made of a Group III nitride compound semiconductor and formed above said light-emitting layer;

an ohmic electrode formed on said contact layer;

a seat electrode formed on said contact layer so that said ohmic electrode is covered with said seat electrode; and a ball electrode for electrically connecting said seat electrode and a circuit wiring of said wiring board to each other;

wherein an area of contact between said seat electrode and said ball electrode is larger than an area of contact between said contact layer and said ohmic electrode.

2. A light-emitting element according to claim 1, wherein a wavelength of light emitted from said Group III nitride compound semiconductor light-emitting element is in a range of from 450 nm to 550 nm.

3. A light-emitting element according to claim 1, wherein the area of contact between said contact layer and said ohmic electrode is not larger than 0.025 mm$^2$.

4. A communication device comprising:

an optical fiber;

a wiring board;

a Group III nitride compound semiconductor light-emitting element mounted on said wiring board in the form of a flip chip and coupled to said optical fiber, said Group III nitride compound semiconductor light-emitting element comprising:

a light-emitting layer;

a contact layer made of a Group III nitride compound semiconductor and formed above said light-emitting layer;

an ohmic electrode formed on said contact layer;

a seat electrode formed on said contact layer so that said ohmic electrode is covered with said seat electrode; and a ball electrode for electrically connecting said seat electrode and a circuit wiring of said wiring board to each other;

wherein an area of contact between said seat electrode and said ball electrode is larger than an area of contact between said contact layer and said ohmic electrode.

5. A communication device according to claim 4, wherein said optical fiber is a plastic optical fiber.

* * * * *